(12) United States Patent
Peco et al.

(10) Patent No.: US 11,274,544 B2
(45) Date of Patent: Mar. 15, 2022

(54) GYRO-BASED SURVEYING TOOL AND METHOD FOR SURVEYING

(71) Applicant: LKAB Wassara AB, Huddinge (SE)

(72) Inventors: Thimaq Tim Peco, Solna (SE); Jarl Hulden, Solna (SE)

(73) Assignee: LKAB Wassara AB, Huddinge (SE)

( * ) Notice: Subject to any disclaimer, the term of this patent is extended or adjusted under 35 U.S.C. 154(b) by 349 days.

(21) Appl. No.: 15/571,474

(22) PCT Filed: May 3, 2016

(86) PCT No.: PCT/SE2016/050392
§ 371 (c)(1),
(2) Date: Nov. 2, 2017

(87) PCT Pub. No.: WO2016/178619
PCT Pub. Date: Nov. 10, 2016

(65) Prior Publication Data
US 2018/0112521 A1    Apr. 26, 2018

(30) Foreign Application Priority Data

May 4, 2015   (SE) .................................... 1550553-0

(51) Int. Cl.
*E21B 47/09*    (2012.01)
*E21B 47/022*   (2012.01)
(Continued)

(52) U.S. Cl.
CPC ............... *E21B 47/09* (2013.01); *B81B 7/02* (2013.01); *E21B 47/022* (2013.01);
(Continued)

(58) Field of Classification Search
None
See application file for complete search history.

(56) References Cited

U.S. PATENT DOCUMENTS

| 6,498,996 | B1 * | 12/2002 | Vallot | .................... | G01C 19/56 |
| | | | | | 702/103 |
| 7,237,437 | B1 * | 7/2007 | Fedora | .................. | B81B 7/0074 |
| | | | | | 73/493 |

(Continued)

FOREIGN PATENT DOCUMENTS

| CA | 2636564 A1 * | 12/2009 | ........... E21B 47/022 |
| CA | 2983940 A1 * | 11/2016 | ........... E21B 47/022 |

(Continued)

OTHER PUBLICATIONS

Machine Translation for CN205714168 (Year: 2016).*
(Continued)

*Primary Examiner* — Catherine T. Rastovski
*Assistant Examiner* — Leonard S Liang
(74) *Attorney, Agent, or Firm* — Morrison and Foerster LLP (57) ABSTRACT

The present disclosure relates to a gyro-based surveying tool for surveying of holes oriented in a basically vertical direction in areas with no line-of-sight connection to the sky. The gyro-based surveying tool comprises a surveying head and an analysing unit. The surveying head comprises a plurality of MicroElectroMechanical-systems-inertial-measurement-unit arrangements, MEMS-IMU arrangements. Each of the MEMS-IMU arrangements is arranged to transmit information relating to their measurement results to the analysing unit. The analysing unit is arranged to receive and analyse said transmitted information relating to the measurement results from the plurality of MEMS-IMU arrangements so as to calculate a combined measurement result. The surveying tool further comprises means for calculating an attitude and/or position of said surveying head based on said combined measurement result.

(Continued)

The present disclosure also relates to a surveying method, a computer program for surveying, and a computer program product.

22 Claims, 2 Drawing Sheets

(51) Int. Cl.
*B81B 7/02* (2006.01)
*E21B 44/00* (2006.01)
*E21B 47/024* (2006.01)
*G01C 21/16* (2006.01)

(52) U.S. Cl.
CPC ....... *B81B 2201/0242* (2013.01); *E21B 44/00* (2013.01); *E21B 47/024* (2013.01); *G01C 21/165* (2013.01)

(56) References Cited

U.S. PATENT DOCUMENTS

| | | | | |
|---|---|---|---|---|
| 8,005,635 | B2* | 8/2011 | Lin | G01C 25/005 701/472 |
| 8,275,544 | B1* | 9/2012 | Wells | G01C 21/165 342/146 |
| 2001/0045128 | A1* | 11/2001 | McCall | G01C 21/16 73/511 |
| 2002/0077768 | A1* | 6/2002 | McCall | G01C 21/16 702/141 |
| 2002/0183958 | A1* | 12/2002 | McCall | G01C 21/16 702/141 |
| 2003/0216884 | A1* | 11/2003 | Cardarelli | G01C 19/5719 702/145 |
| 2005/0022402 | A1 | 2/2005 | Ash et al. | |
| 2006/0184336 | A1* | 8/2006 | Kolen | G01C 19/00 702/150 |
| 2007/0203639 | A1* | 8/2007 | Van Den Broeck | E21B 47/022 701/532 |
| 2007/0240486 | A1* | 10/2007 | Moore | G01C 21/16 73/1.37 |
| 2007/0289373 | A1* | 12/2007 | Sugiura | E21B 7/062 73/152.46 |
| 2008/0004796 | A1 | 1/2008 | Schott et al. | |
| 2009/0089001 | A1* | 4/2009 | Lin | G01C 21/16 702/92 |
| 2009/0287451 | A1 | 11/2009 | Sato et al. | |
| 2009/0288485 | A1* | 11/2009 | Ell | G01C 21/16 73/504.03 |
| 2009/0314546 | A1* | 12/2009 | Mintchev | E21B 7/04 175/45 |
| 2009/0326740 | A1* | 12/2009 | Wang | G01C 23/00 701/3 |
| 2010/0223796 | A1 | 9/2010 | Imamura et al. | |
| 2011/0015862 | A1 | 1/2011 | Sato et al. | |
| 2012/0203487 | A1* | 8/2012 | Johnson | G01P 21/00 702/104 |
| 2013/0124095 | A1* | 5/2013 | Sugiura | E21B 44/00 702/9 |
| 2013/0181086 | A1* | 7/2013 | Bielas | G01C 21/16 244/3.22 |
| 2014/0022539 | A1* | 1/2014 | France | G01C 15/00 356/139.1 |
| 2014/0336928 | A1* | 11/2014 | Scott | G01N 21/88 701/468 |
| 2015/0204674 | A1* | 7/2015 | Kadosh | G01C 21/16 701/500 |
| 2015/0268045 | A1* | 9/2015 | Dusha | G01C 15/06 33/228 |
| 2015/0268058 | A1* | 9/2015 | Samarasekera | G08G 5/0073 701/409 |
| 2016/0153767 | A1* | 6/2016 | Ihlenfeldt | G01B 11/005 33/503 |
| 2016/0320426 | A1* | 11/2016 | Boysel | G01P 15/0802 |
| 2016/0361014 | A1* | 12/2016 | Kane | A61B 5/1121 |
| 2017/0030788 | A1* | 2/2017 | Boysel | G01L 13/025 |
| 2017/0138716 | A1* | 5/2017 | Ihlenfeldt | G01B 11/005 |
| 2018/0002163 | A1* | 1/2018 | Boysel | B81B 7/007 |
| 2018/0074090 | A1* | 3/2018 | Boysel | G01L 19/0076 |
| 2018/0149480 | A1* | 5/2018 | Wang | E21B 44/005 |
| 2018/0371894 | A1* | 12/2018 | Wang | E21B 47/02216 |
| 2019/0056422 | A1* | 2/2019 | Park | G01P 13/00 |
| 2019/0169979 | A1* | 6/2019 | Nguyen | E21B 47/09 |

FOREIGN PATENT DOCUMENTS

| | | | |
|---|---|---|---|
| CN | 205714168 | U * | 11/2016 |
| WO | 2005100916 | A1 | 10/2005 |
| WO | 2014145259 | A2 | 9/2014 |
| WO | 2015047262 | A1 | 4/2015 |
| WO | 2015054432 | A1 | 4/2015 |

OTHER PUBLICATIONS

Hanson, Ryan—Thesis; Using Multiple MEMS IMUs to Form a Distributed Inertial Measurement Unit; Presented to the Faculty Department of Electrical and Computer Engineering Graduate School of Engineering and Management Air Force Institute of Technology; Mar. 2005. (Year: 2005).*

Kang J., Wang B., Hu Z., Wang R., & Liu T. (2009). Study of Drill Measuring System Based on MEMS Accelerative and Magnetoresistive Sensor. The Ninth International Conference on Electronic Measurement & Instruments, 2-112-2-116. (Year: 2009).*

Estes R.A. & Epplin D.M. (2000). Development of a Robust Gyroscopic Orientation Tool for MWD Operations. Paper prepared for presentation at the 2000 SPE Annual Technical Conference and Exhibition held in Dallas, Texas, Oct. 1-4, 2000, 1-13. (Year: 2000).*

International Search Report for PCT Application No. PCT/SE2016/050392, dated Jul. 6, 2016, 4 pages.

* cited by examiner

GYRO-BASED SURVEYING TOOL AND METHOD FOR SURVEYING

CROSS REFERENCE TO RELATED APPLICATIONS

This application is a U.S. National Phase patent application of PCT/SE2016/050392, filed May 3, 2016, which claims priority to Swedish Patent Application No. SE 1550553-0, filed May 4, 2015, the disclosures of which are incorporated herein by reference in their entirety.

TECHNICAL FIELD

The disclosure relates to a gyro-based surveying tool for surveying of holes oriented in a basically vertical direction in areas with no line-of-sight connection to the sky, to a surveying method, to a computer program and to a computer program product.

BACKGROUND ART

When surveying it is common to use surveying tools which work with the help of global navigation satellite systems, GNSS. These surveying tools demand, however, a line of sight to the sky so that signals from the satellites can be received without being damped too much. When surveying areas or spaces without line-of-sight connection to the sky thus other means have to be used for surveying. This is especially important when surveying inside mountains or in holes. Such surveying inside mountains is for example important in tunneling or mining. Such surveying inside holes is for example important for drilling holes, geothermal holes, mining holes, oil holes, gas holes, or the like. Other kinds of ground engineering, such as dams, might also require other techniques.

Techniques and tools for surveying in areas without line-of-sight connection to the sky are known. These techniques can, for example, be based on optical means or on a gyroscope. Gyroscopes can, however, drift and this drift will add over time. This leads to the fact that in general the longer a gyroscope is used the more will the uncertainty of the surveying be. Especially when using a gyroscope in drilling applications it is often economically demanded that the surveying tool with the gyroscope is basically permanently close to the drilling bit since a removing, recalibration and reinsertion would require much of time under which no drilling could be performed.

A solution for this problem is using a highly stable gyroscope where the manufacturer guarantees performance of the gyroscope in respect to certain maximum measurement errors or measurement drifts. Such gyroscopes are, however, due to their complexity and/or due to their need of especially careful assembling/manufacturing only available at a relatively high cost. There is therefore a need for gyro-based surveying tools with drastically lowered cost of production and operation, but with basically no impairment in their accuracy.

Further, many of the highly stable gyroscope usually have a considerable size, for example sizes exceeding 50×50 mm. This makes them impossible to use in slim-hole configurations often requiring a diameter of less than 38 mm for the surveying and/or drilling equipment.

SUMMARY OF THE INVENTION

It is thus an object of the invention to improve gyro-based surveying tools and surveying methods.

Another object of the invention is to present an alternative gyro-based surveying tool and an alternative surveying method.

Yet another object of the invention is to reduce cost for surveying.

Yet another object of the invention is to reduce size of surveying tools, preferably without sacrificing substantially their accuracy.

At least some of the objects are achieved by a gyro-based surveying tool for surveying of holes oriented in a basically vertical direction in areas with no line-of-sight connection to the sky. The gyro-based surveying tool comprises a surveying head and an analysing unit. The surveying head comprises a plurality of MicroElectroMechanical-systems-inertial-measurement-unit arrangements, MEMS-IMU arrangements. Each of the MEMS-IMU arrangements is arranged to obtain measurement results. The gyro-based surveying tool further comprises transmission means arranged to transmit information relating to the obtained measurement results from the MEMS-IMU arrangements to the analysing unit. The analysing unit is arranged to receive and analyse said transmitted information relating to the measurement results from the plurality of MEMS-IMU arrangements so as to calculate a combined measurement result. The surveying tool further comprises means for calculating an attitude and/or position of said surveying head based on said combined measurement result.

By using a plurality of MEMS-IMU both cost and size can be reduced. The MEMS-IMU which can be used are orders of magnitude cheaper than state of the art highly stable surveying sensors. The MEMS-IMU which can be used are also much smaller than state of the art highly stable surveying sensors. Such MEMS-IMU which can be used are for example MEMS-IMU which nowadays are used in remote controls, mobile phones or the like and which have much less requirements on their accuracy than surveying sensors. By combining a plurality of these low-cost MEMS-IMU according to the invention one can achieve comparable accuracy or even better accuracy than with highly stable sensors for surveying. Although a plurality of MEMS-IMU is needed, this combined size and price of this plurality of MEMS-IMU is still significantly lower or smaller than the size or prize for highly stable MEMS-IMU. In one example the gyro-based surveying tool for surveying of holes oriented in a basically vertical direction in areas with no line-of-sight connection to the sky is a bore hole and/or wellbore surveying tool.

A surveying tool according to the disclosure might even be constructed at such low cost that it can be designed for a one-time, or at least one-time period use only. Conventional surveying tools need to be calibrated from time to time to keep their accuracy. When used in connection with drilling this calibration requires taking the conventional surveying tool out of the drilling hole, performing a calibration procedure which takes some time and putting the surveying tool back into the drilling hole. During the calibration procedure no drilling can be performed. The surveying tool according to the present disclosure can simply be replaced by another one instead of calibrating it since its production cost can be less than the cost for not using the drilling equipment due to the time for calibration. Costs are further reduced since a failure of one or some of the MEMS-IMU during operation can be compensated by simply using the remaining MEMS-IMU. This is to be compared to the state of the art single highly stable surveying tool which required to be taken out of the drilling hole in case of failure.

In one embodiment the measurement results comprise angular rate data and/or acceleration data.

In one embodiment the gyro-based surveying tool comprises means for determining a trajectory of the surveying head. This makes it possible to determine the extension of the hole.

In one embodiment the gyro-based surveying tool further comprises a user unit which is physically separated from the surveying head. The gyro-based surveying tool further comprises a linking arrangement which is arranged to transmit information from the surveying head to the user unit. This allows for easy control of the surveying. It further allows for controlling a drilling method based on the results from the surveying tool.

In one embodiment the analysing unit is arranged to calculate angular rate averaging and/or acceleration averaging of the measurements from the plurality of the MEMS-IMU arrangements. The angular rate averaging and/or acceleration averaging is then used to calculate said combined measurement result. This is a computational simple method of calculation.

In one embodiment the gyro-based surveying tool further comprises means for determining heighten along-the-hole distance of the surveying head. This can help in determining the position of the surveying head In one embodiment the plurality of the MEMS-IMU arrangements is non-north-seeking. This allows using the disclosure in a magnetically disturbed environment.

In one embodiment the plurality of MEMS-IMU arrangements comprises at least three MEMS-IMU arrangements, preferably at least sixteen MEMS-IMU arrangements.

In one embodiment the surveying head is arranged to be inserted into a hole, preferably a drilling hole or a drilled hole.

In one embodiment the surveying head is arranged at or in a drilling arrangement, for example a bottom hole assembly.

Especially when using the invention while drilling a significant cost reduction can be achieved.

In one embodiment the gyro-based surveying tool further comprises a temperature stabilisation arrangement which is arranged at the plurality of MEMS-IMU arrangements and adapted to control the temperature of the plurality of MEMS-IMU arrangements.

This further improves the accuracy of the surveying tool. It further improves the cost-saving aspects. Although a temperature stabilisation is an additional component, such a component can be supplied at relatively low cost. On the other hand, a temperature stabilisation dispenses with the requirement of calibrating the arrangement for a temperature dependency. Such a calibration of a MEMS-IMU for temperature dependency can be orders of magnitudes higher than the component price for a temperature stabilisation.

In one embodiment the analysing unit is arranged to use a signal modelling model of the plurality of MEMS-IMU arrangements. The signal modelling model is preferably based on a Markov chain model, preferably on a first order Markov chain model. This also further improves the accuracy of the surveying tool. Especially when used while drilling the influence of noise is reduced significantly. Since it is, for example due to the construction of a BHA, impossible during drilling to get two consecutive measurements with a big angle difference, one measurement constrains the possible outcome of the next measurement. In this situation a first order Markov model is usually fully enough, thereby saving calculation effort.

At least some of the above objects are also achieved by a surveying method for surveying of holes oriented in a basically vertical direction in areas with no line-of-sight connection to the sky. The method comprises the step of measuring angular rates and accelerations with a plurality of inertial-measurement-units, IMU, inside a surveying head. The method further comprises calculating combined angular rates and accelerations based on the measured angular rates and accelerations from each of the IMU out of the plurality. The method even further comprises calculating an attitude of the surveying head based on the combined angular rates and accelerations.

The method and its different examples have similar advantages as the corresponding surveying tool.

In one example the surveying method further comprises the step of calculating a position of the surveying head based on the calculated attitude and based on an along-the-hole distance of the surveying head.

In one example the surveying method further comprises the step of calculating a trajectory of the surveying head based on a set of several calculated positions of the surveying head, wherein the several calculated positions are calculated for different moments of time.

In one example the step of calculating a position of said surveying head comprises basing the calculation on a set of several combined angular rates and accelerations, wherein the several combined angular rates and accelerations are calculated for different moments of time.

In one example the calculated position is a relative position of said surveying head.

In one example the surveying method further comprises transmitting the measured angular rates and accelerations to an analysing unit. The step of calculating said combined angular rates and accelerations is performed by said analysing unit.

In one example the surveying method further comprises controlling the temperature of the plurality of IMU.

In one example the surveying method is used for the surveying of a bore hole or a wellbore.

In one example the surveying method further comprises damping the vibration of the plurality of IMU.

In one example the surveying method further comprises modelling the signal of the plurality of the IMU, preferably based on a Markov chain model, preferably on a first order Markov chain model. The calculation of a combined angular rate and acceleration is also based on said model.

The present disclosure also relates to a computer program for surveying. Said computer program comprises program code for causing execution of a method according to the disclosure.

The present disclosure also relates to a computer program product. The computer program product comprises a program code stored on a computer readable medium for executing the method according to the present disclosure. The computer readable medium is in one example a non-volatile medium.

DETAILED DESCRIPTION

Throughout this document the term "bore hole" can relate to both a drilled hole and a drilling hole. In one example, the term "basically vertically" relates to a vertical direction which can deviate up to six degrees (out of a 360 degrees full circle) from the vertical direction. In one example, the term vertical comprises vertical upwards. In one example, the term vertical comprises vertical downwards.

Figure 1:
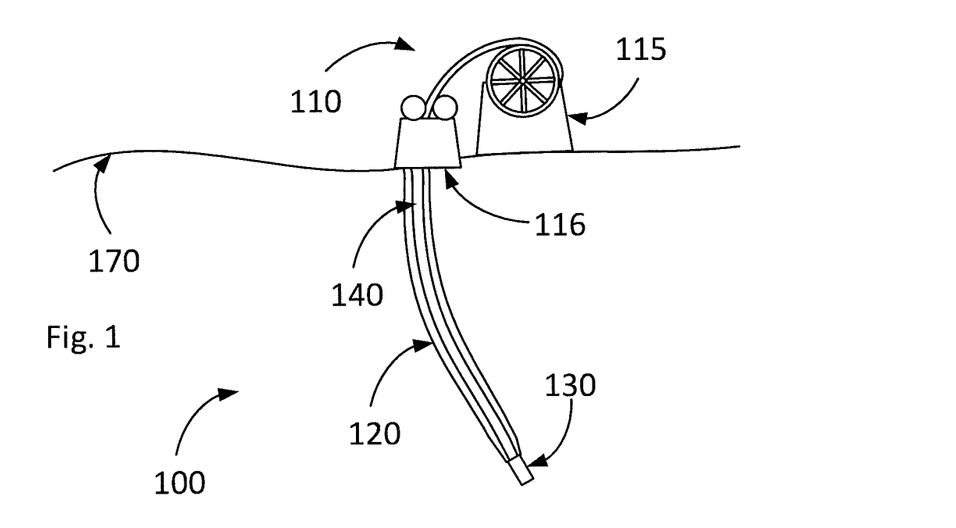
FIG. 1 shows a schematic example of a situation in which the present disclosure can be used.

FIG. 1 shows a schematic example of a situation in which the present disclosure can be used. It should be emphasized that the shown example is not to scale. In FIG. 1 a soil 170 is shown. A drilling arrangement 100 is shown for drilling a drilling hole 120. The drilling hole can, for example, be a bore hole or a wellbore. In one example, the drilling arrangement 100 is a coiled tubing, CT, drilling arrangement. The drilling arrangement 100 can comprise a tube 140. One part of the tube 140 can be in the drilling hole 120 and another part of the tube 140 can be outside the drilling hole 120. At one end of the tube 140 there is arranged a bottom hole assembly, BHA, 130. The drilling arrangement 100 also comprises a drill rig arrangement 110. The drill rig arrangement 110 is usually outside the drilling hole 120. The drill rig arrangement 110 comprises CT drum 115. The CT drum 115 is arranged to carry the part of the tube 140 which is outside the drilled hole 120. The drill rig arrangement 110 also comprises an injection arrangement 116. The injection arrangement 116 is arranged to inject the tube 140 into the drilling hole 120.

In one embodiment the drill rig arrangement 110 is put on a carrier (not shown). Such a carrier can then comprise the injection arrangement 116 and the CT drum 115. The carrier can also comprise electricity and water supply. The carrier can further comprise a drill boom and/or guiding arches. In one example the carrier is a vehicle.

In another embodiment the drill rig arrangement 110 is an oil tower or a derrick. In principle, the drill rig arrangement 110 can be any kind of suitable drill rig arrangement. The present disclosure is also especially useful for wellbores or bore holes. The present disclosure can, however, also be used for any other kind of holes. Consequently, the drill rig arrangement 110 can be any arrangement which can be used to achieve a wellbore, a bore hole or any other kind of hole.

When used in connection with a drill rig arrangement 110 the present disclosure can be used while drilling the drilling hole 120. In another example, the present disclosure can be used for a pre-drilled hole. Throughout this disclosure the words pre-drilled hole and drilled hole will be used interchangeably. No different meaning is intended. The present disclosure can thus be use post drilling. In that example no drill rig arrangement 110 is necessary.

In the shown example the drilling hole 120 is drilled downwards. A drilling hole, a drilled hole or any other kind of hole can, however, equally well be drilled, have been drilled or extend upwards. In one example, the present disclosure is thus used for upward drilling, or for upward drilled holes. These upward holes exist for example in mining industry. As an example, one can drill upward from a mining gallery. It is also possible to use the present disclosure for any other direction than upwards or downwards.

The present disclosure is not restricted to holes. The present disclosure is suitable for use in any areas where no line-of-sight connection exists to the sky. This can for example be in a tunnel, in a mining gallery, in a duct, or the like. Although especially suitable for using in areas where no line-of-sight connection exists to the sky, the present invention can in principle also be applied in any other area.

Figure 2:
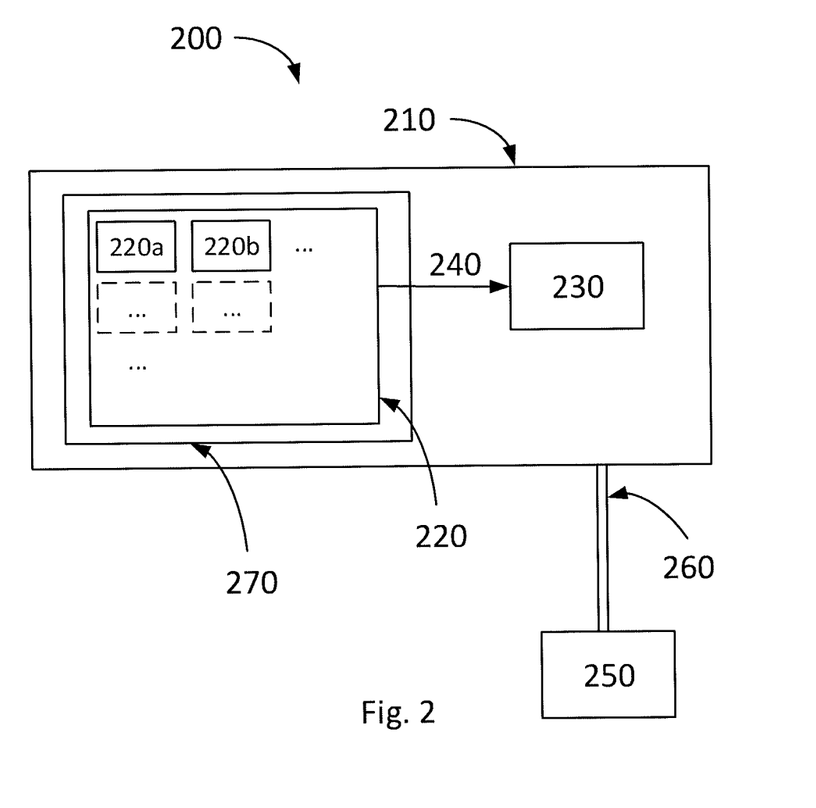
FIG. 2 shows a schematic embodiment of a gyro-based surveying tool according to the present invention.

In FIG. 2 different schematic embodiments of a gyro-based surveying tool 200 are shown. The gyro-based surveying tool 200 comprises a surveying head 210 and an analysing unit 230. In the shown example the analysing unit 230 is placed on the surveying head 210. This is, however, not a requirement. The surveying head 210 is in one example arranged at or in the drilling arrangement 100, for example the bottom hole assembly 130. Especially when surveying while drilling it might be advantageous to place the surveying head 210 directly at or in the BHA 130.

In another example, the surveying head 210 is arranged at or in a surveying tool arrangement without drilling capacity (not shown). This might be especially useful when using the gyro-based surveying tool 200 in post-drilling.

In one example, the analysing unit 230 is placed at or in a drill rig arrangement 110. The analysing unit 230 might thus be outside the drilled hole or the drilling hole 120. The analysing unit 230 might be placed at a distance from the surveying head 210. The analysing unit 230 might thus be outside a hole, a tunnel, or a similar arrangement which is to be surveyed. The analysing unit might, however, instead be inside the hole, the tunnel or the similar arrangement which is to be surveyed, but still at a distance to the surveying head 210. The analysing unit 230 might in one example be in a user unit 250.

The surveying head 210 comprises a plurality 220 of MicroElectroMechanical System-Inertial Measurement Unit, MEMS-IMU, arrangements 220a, 220b, . . . . The plurality 220 of MEMS-IMU arrangements comprises in one example of three, four, eight, sixteen, thirty-two, or sixty-four MEMS-IMU arrangements. In another example more than sixty-four MEMS-IMU arrangements are used. In one example the plurality 220 of MEMS-IMU arrangements comprises between three and sixty-four MEMS-IMU arrangements, for example between four and sixty-four MEMS-IMU arrangements, or between eight and sixty-four MEMS-IMU arrangements, or between sixteen and sixty-four MEMS-IMU arrangements. In one example the sixteen IMU are arranged in a coplanar four times four configuration. In a preferred example thirty two MEMS-IMU arrangements are used. As an example, half of the MEMS-IMU arrangements can be on one side of a circuit board and the other half of the MEMS-IMU arrangement on the other side of the circuit board.

Each of the MEMS-IMU arrangements 220a, 220b, . . . is arranged to obtain measurement results. Transmission means are arranged to transmit information 240 relating to the obtained measurement results to the analysing unit 230. The transmissions means could be any kind of transmissions means and, for example, comprise wires.

Each of the MEMS-IMU arrangements 220a, 220b, . . . , comprises preferably an accelerometer and a gyroscope. Said accelerometers are preferably triaxial. Said gyroscopes are preferably triaxial. Each of the MEMS-IMU arrangements 220a, 220b, . . . , is preferably a six degrees of freedom sensor, 6Dof-sensor. These 6DoF relate in one example to three degrees of freedoms in acceleration and three degrees of freedoms in angular rate. The three degrees of freedoms of acceleration can, for example, be measured along the three axes of a three-dimensional Cartesian coordinate system. The three degrees of freedoms in angular rate are in one example measured around the axes of a Cartesian coordinate system. It is, however, not a requirement that a Cartesian coordinate system is used. The Cartesian coordinate systems for the angular rate and the acceleration coincide in one example. In a preferred example, the three axes of the gyroscope are mutually non-parallel. In a preferred example, the three axes of an accelerometer are mutually non-parallel. In a preferred example, the three axes of the gyroscope are not ail coplanar. In a preferred example, the three axes of the accelerometer are not all coplanar.

The information 240 relating to the measurement results of each of the MEMS-IMU arrangements 220a, 220b, ..., comprises in one example at least information relating to the three degrees of acceleration and/or three degrees of angular rate. In one example the measurement results and/or information 240 comprises angular rate data and/or acceleration data. In one example the MEMS-IMU arrangements 220a, 220b are arranged to transmit at least information relating to acceleration in three non-parallel directions to the analysing unit 230. In one example the MEMS-IMU arrangements 220a, 220b are arranged to transmit at least information relating to angular rate around three non-parallel directions to the analysing unit 230. The information relating to acceleration is in one example a measured acceleration. In one example, the information relating to acceleration is information which can be converted into acceleration. The information relating to angular rate is in one example a measured angular rate. In one example, the information relating to angular rate is information which can be converted into angular rate. In one example measurement results relating to the temperature of the plurality of the MEMS-IMU arrangement and/or measurements results relating to the vibration of the plurality of the MEMS-IMU arrangement are transmitted to the analysing unit 230.

An example of MEMS-IMU arrangements which can be used in the present disclosure is the Bosch BMI055 6-axis inertial sensor.

One advantage of using MEMS-IMU arrangements as described above is their possible small size. Such MEMS-IMU arrangements are available with a size of less than 5 mm×5 mm×1 mm, making them well suitable for slim-hole configurations. Another advantage is that these MEMS-IMU arrangements are available for less than ten euros per piece. This can be compared to a price of thousands of euros for a highly stabilised sensors currently used in surveying in areas with no line-of-sight connection to the sky. It has been turned out that providing a plurality 220 of the MEMS-IMU arrangements and arranging them according to the present disclosure provides comparable results regarding measurement accuracy and drift as highly stabilised prior art sensors. The present disclosure thus allows surveying at a reduced cost.

Figure 5:
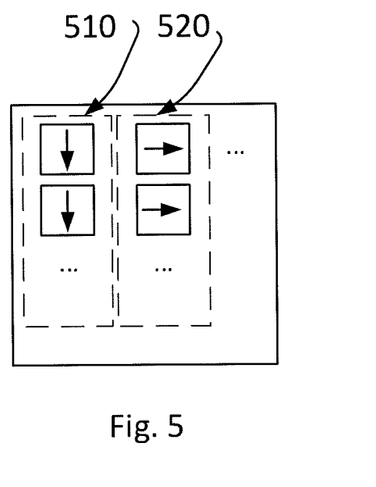
FIG. 5 shows a possible orientation of groups of MEMS-IMU according to an embodiment of the present disclosure.

In one example, the MEMS-IMU arrangements are not all oriented in the same direction. In one example, the MEMS-IMU arrangements are arranged in groups. In one example, a first axis of one group of MEMS-IMU arrangements is parallel to a second axis of another group of MEMS-IMU arrangements. As an example, the y-axis of a first group of MEMS-IMU arrangements can be parallel to the x-axis of a second group of MEMS-IMU arrangements and/or a z-axis of a third group of MEMS-IMU arrangements. It can happen that the measurement accuracy of a specific MEMS-IMU arrangement design is significantly higher for a first axis as compared to a second axes. By orienting groups of MEMS-IMU arrangements in different ways it is thus assured that measurements along different axes can achieve high measurement accuracies. An example is shown in FIG. 5. A first group 510 of MEMS-IMU arrangements is oriented in a first direction. The arrows in the figure define an orientation of the MEMS-IMU. A second group 520 of MEMS-IMU is oriented in a different way. As an example, in case a measurement in the direction of the arrow would give a less accurate result, the orientation of the second group 520 of MEMS-IMU could compensate for the less accuracy of the measurements in the direction of the arrows of the first group 510 of MEMS-IMU, and vice versa.

In one example the MEMS-IMU arrangements are non-north-seeking. This allows the surveying tool 200 to be used in a magnetically disturbed area.

The analysing unit 230 is arranged to receive and analyse the transmitted information 240 relating to the measurement results from the plurality 220 of MEMS-IMU arrangements so as to calculate a combined measurement result. In one example the analysing unit 230 is arranged to calculate angular rate averaging and/or acceleration averaging of the measurements from the plurality 220 of the MEMS-IMU arrangements. In one example the measurement results from the plurality 220 of MEMS-IMU arrangements are transferred into a common coordinated system before said averaging is performed. This might be performed when not all MEMS-IMU arrangements are oriented in the same way. The transferring can be done by the analysing unit 230. Orienting all of the MEMS-IMU arrangements of the plurality 220 of MEMS-IMU arrangements in the same direction will reduce calculation effort. On the other hand, when orienting the MEMS-IMU arrangements in different directions, it can be compensated for differences in the accuracy of the measurement results of the MEMS-IMU arrangements along different axes. If the acceleration measurement along an x-axis, for example, is more accurate than the acceleration measurement along a y-axis, some of the MEMS-IMU arrangements can be oriented so that their y-axis coincides with the x-axis of other MEMS-IMU arrangements to achieve a similar total accuracy along the axes. Such considerations are dependent on the actual properties of the MEMS-IMU arrangements in use. A person skilled in the art is thus free to orient the MEMS-IMU arrangements in such a way that a good compromise between calculation effort and needed accuracy is achieved.

The combined measurement result is on one example calculated based on said angular rate averaging and/or acceleration averaging. In one example, the averaging is a weighted averaging. The averaging is in one example weighted with respect to the accuracy of the respective MEMS-IMU arrangements.

The surveying tool 200 comprises means 230; 250 for calculating an attitude and/or position of the surveying head based on the combined measurement result. In one example the means for calculating an attitude and/or position of the surveying head is the analysing unit 230. In one example the means for calculating an attitude and/or position of the surveying head is the user unit 250. How an attitude and/or position for the surveying head can be calculated will be explained in more detail in relation to FIG. 3.

The surveying tool 200 can comprise a user unit 250. The user unit 250 is then separated from the surveying head 210. In one example the user unit 250 is arranged at the drill rig arrangement 110. This allows for an operator of the drill rig arrangement 110 to control the drilling arrangement 100 based on information from the surveying tool 200. The user unit 250 can also be situated at any other place such as a control room. The user unit 250 could also be a mobile unit.

When comprising a user unit 250, the surveying tool will also comprise a linking arrangement 260. The linking arrangement is then arranged to transmit information from the surveying head 210 to the user unit 250. The linking arrangement 260 is in one example a wire or an optical fibre. In another example, the linking arrangement 260 is a wireless communication arrangement. In yet another example, the linking arrangement 260 combines wired communication with wire-less communication. In one example, the linking arrangement 260 transmits information from the analysing unit 230 to the user unit 250. In another example, the linking arrangement 260 transmits information from the plurality 220 of MEMS-IMU arrangements to the analysing unit 230. This might be the case when the analysing unit 230 is at the user unit 250. Said information comprises in one example a calculated attitude, position and/or trajectory of the surveying head. In one example said information comprises measurement results from the plurality of MEMS-IMU.

The surveying tool 200 can comprise means for determining the depth or the height of the surveying head 210. This depth or height can relate to an absolute depth or height, for example in relation to the sea level. This depth or height can also relate to a relative depth or height, for example in relation to a base arrangement such as the drill rig arrangement 110. In one example the means for determining the depth or the height of the surveying head 210 is or can comprise the user unit 250. When drilling with CT technology the user unit 250 can control the length of the tube 140 which has passed the injection arrangement 116. When drilling with another technology or when using post-drilling the user unit 250 can control the length of a connecting arrangement between the surveying head and a base arrangement. The base arrangement could, for example, be the drill rig arrangement 110. The base arrangement can also be an injection arrangement for the surveying tool 200. The connecting arrangement can be the tube 140. In another example, the connecting arrangement is a cable, a wire, a fibre, or any other solid connection. Since the surveying head usually is tightly bound in the hole 120, the distance of the connecting arrangement between the base arrangement and the surveying head 210 in general corresponds to the distance between the surveying head 210 and the base arrangement.

In one example, the surveying tool 200 can comprise means for determining an along-the-hole depth of the surveying head 210. An example of means for determining the along-the-hole depth is an external winch and/or equipment containing at least one reliable depth-encoder. It should be stressed that the term along-the-hole depth should not only refer to a hole which is directed downwards, but could relate to holes in any direction, for example upwards or sidewards. The expression along-the-hole depth can then be replaced by along-the-hole distance. The means for determining an along-the-hole depth can still be used since an external winch, for example can measure the along-the-hole distance irrespective of the direction of the hole.

In one example the surveying tool comprises means for determining a trajectory of the surveying head. This means is in one example the user unit 250 and/or the analysing unit 230. How the trajectory can be determined will be described in more detail in relation to FIG. 3.

In one example, the analysing unit 230 is arranged to use a signal modelling model of the plurality 220 of MEMS-IMU arrangements. The signal modelling model is preferably based on a Markov chain model, preferably on a first order Markov chain model. The signal model can be used to improve the accuracy of the surveying tool 200. How this is done will be explained in more detail in relation to FIG. 3.

In one example the surveying tool 200 further comprises a temperature stabilisation arrangement 270. The temperature stabilisation arrangement 270 is then arranged at the plurality 220 of MEMS-IMU arrangements so as to control the temperature of the plurality 220 of MEMS-IMU arrangements. The temperature stabilisation arrangement 270 is in one example what is commonly known as a crystal oven. This allows controlling the temperature of the MEMS-IMU arrangements so that the measurement results from the MEMS-IMU arrangements will not drift due to temperature changes, or at least that these drifts are greatly reduced. Since crystal ovens are well known in the art they will not be described here any further. A temperature stabilisation can greatly reduce any cost related to calibration of the MEMS-IMU.

In one example, the temperature is stabilised at a temperature of more than 40 degrees Celsius. In one example, the temperature is stabilised at a temperature of more than 45 degrees Celsius. In one example, the temperature is stabilised at a temperature of around 50 degrees Celsius.

Figure 3:
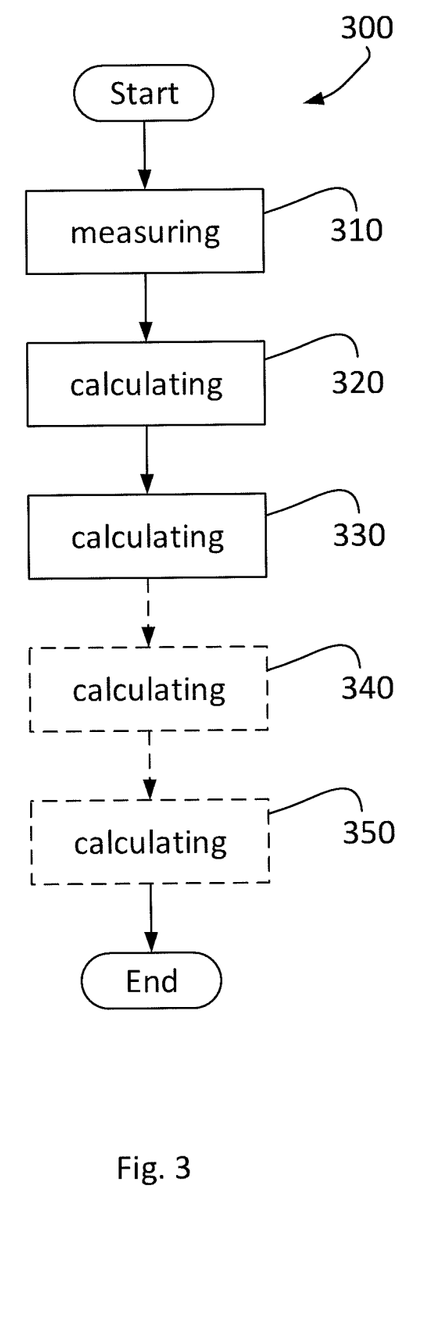
FIG. 3 shows a flowchart of a surveying method according to the present disclosure.

FIG. 3 shows a flowchart of a surveying method 300 for surveying of holes oriented in a basically vertical direction in areas with no line-of-sight connection to the sky according to the present disclosure. The method can thus be performed when no signals from Global Navigation Satellite Systems, GNSS, such as GPS, are available at the place for surveying. Such places are for example bore holes, wellbores, tunnels or other similar areas. The method starts with the step 310.

In step 310 angular rates and accelerations are measured with a plurality of inertial measurement units, IMU, inside a surveying head 210. In one example, every IMU out of the plurality of the IMU measures the angular rates and the accelerations. In one example the plurality of IMU comprises IMU for the detection of accelerations and angular rates in six degrees of freedom. Said acceleration is thus in one example measured along three axes, for example along three main axes of an orthogonal coordinate system. These axes can be denoted x-, y-, and z-axis. In one example said IMU comprise accelerometers and said accelerations is be measured by at least one accelerometer.

In one example said IMU comprise gyroscopes and said angular rates are measured by at least one gyroscope. The angular rate can, for example, be measured in degrees per second. In one example the orientation is measured by monitoring the angular rate around the main axes of an orthogonal coordinate system. This can, for example, be the so-called pitch-, roll- and yaw-angles. Said orthogonal coordinate system can coincide with the coordinate system for the acceleration measurement. The term "measure" should be treated in a broad sense in the relation to step 310. It should not only include a literal measurement of the values. In one example, other quantities are measured which are then converted into angular rates and accelerations by the plurality of IMU. Thus the expression measuring angular rates and accelerations refers should cover also other measurements which are then converted into angular rates and accelerations.

In one example the temperature of said plurality of IMU is controlled. This temperature controlling is preferably performed at least during the measurement of the angular rates and accelerations. The control is preferably performed in such a way that the temperature is kept stable, or at least inside a certain temperature interval. The temperature interval can be chosen in such a way that a measurement drift and/or measurement uncertainty is below a pre-determined limit. A means for controlling the temperature is for example the crystal oven as describe in connection with FIG. 2. After step 310 a consecutive step 320 is performed.

Figure 4:
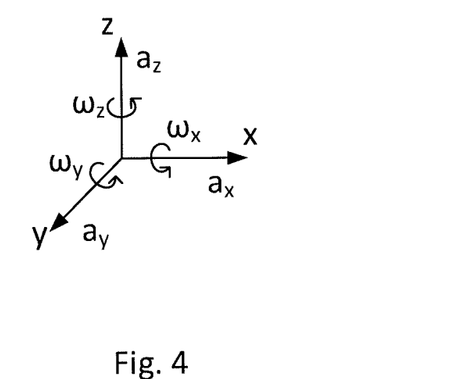
FIG. 4 shows an example of a coordinate system as it can be used in combination with the present invention.

In step 320 combined angular rates and accelerations are calculated based on the measured angular rates and accelerations from each of the IMU out of the plurality of IMU. This is in one example done by averaging the angular rates and the accelerations from the different IMU. This can for example be done by averaging the acceleration and/or the angular rates along three axes and/or around three axes, respectively. The three axes are preferably orthogonal, but can in principle have any non-parallel orientation to each other. In case the axes of the IMU do not coincide a coordinate transformation can be performed with respect to the measured accelerations and/or angular rates before the averaging is performed. An example is shown in FIG. 4. There the acceleration is measured in three orthogonal components $a_x$, $a_y$, and $a_z$. This can be done individually in each IMU. Also the combined accelerations can be along the three axes as depicted in FIG. 4. The angular rates are measured around three orthogonal axes and will have components $\omega_x$, $\omega_y$, and $\omega_z$. This can be done individually in each IMU. Also the combined angular rates can be around the three axes as depicted in FIG. 4. In the example of FIG. 4 the coordinate systems for acceleration and angular rates coincide. This is, however, not a requirement. In principle the coordinate systems for the accelerations and the angular rates are independent of each other. In one example the averaging is a weighted averaging. This is described in more detail in relation to FIG. 2. After step 330 a consecutive step 330 is performed.

In step 330 an attitude of the surveying head 210 is calculated based on the combined angular rates and accelerations. This is known in the art how to do since IMU are often used for calculating the attitude. Thus the combined angular rates and accelerations are in one example used for calculating the attitude as if they would originate from a single IMU. In one example the attitude is calculated as Euler angles; pitch, yaw and roll angle. In one example the attitude is calculated as pitch, yaw and roll angle. In one example the attitude is calculated as quaternions. Having the attitude of the surveying head is an important information in case the surveying head is used in combination with a BHA 130, for example while drilling. Thus will allow to determine in which direction the BHA is oriented and thus in which direction a drilling operation is performed. This information can then be used to control a hammer or another drilling equipment. In one example the method ends after step 330. In another example the method continues with a consecutive step 340.

In step 340 a position of the surveying head is calculated based on the calculated attitude. The position of the surveying head is in one example also calculated based on a height or depth of the surveying head 210. In one example the position of the surveying head is calculated based on an along-the-hole distance of the surveying head 210. The calculated position can be an absolute position. In another example the calculated position is a relative position. The calculated position could, for example, be a relative position in relation to a starting point, for example a drill rig arrangement. In one example the method ends after step 340. In another example the method continues with a consecutive step 350.

In step 350 a trajectory of the surveying head 210 is calculated based on a set of several calculated positions of the surveying head 210. The several calculated positions are calculated for different moments of time. The trajectory does in one example contain all the calculated positions. The sections between the calculated positions are in one example approximated as straight lines when calculating the trajectory. In one example the trajectory is calculated as being the minimum curvature line with respect to the calculated positions. Even any other fitting method can be used for calculating the trajectory based on the set of several calculated positions. After step 350 the method ends.

While performing the method 300 one can damp in one example the vibration of the surveying head. This might be useful when using while drilling. A huge variety of damping techniques are known. The actual damping technique might depend on the size of the area to survey, for example the hole 120. The damping is in one example performed in such a way so as to damp the vibrations of the surveying head to be below a pre-determined threshold. The pre-determined value can for example be 4, 8, 16 or 32 g, where g is the gravitation acceleration. In one example the gravitational acceleration is defined as a reference, for example as 9.8 meter per second squared. The damping can be useful for keeping the IMU in a specified modus of operation for which the measurement results are not influenced more than a pre-determined value due to the vibrations.

While performing the method 300 one can model the signal of the plurality 220 of the IMU. The modelled signal can then be used in one of the calculations, for example in step 320, 330, 340 or 350. Preferably the calculation of the combined angular rate and acceleration is based on the signal model. The signal modelling is in one example based on a Markov chain model, preferably on a first order Markov chain model. A first order Markov chain model turned out to be a good compromise between calculation effort and the improvement in accuracy which could be achieved. This might be helpful when using in a noisy environment, for example when used while drilling. This is due to the fact that vibrations while drilling could be a source for noise.

In one example the method 300 is used for continuous surveying. In that case the steps of the method might be repeated continuously. In one example the method might comprise an additional step of re-calibrating. This step of re-calibration can, for example, be performed after a pre-determined period of time. In one example this period of time is two minutes. In one example this period of time is at least two minutes. During the re-calibration step an angular rate offset R can be measured. This angular rate offset R can then be merged with the previous angular rate offset in an Infinite Impulse Response filter, IIR-filter, or an Finite Impulse Response filter, FIR-filter. In one example the attitude is calculated by performing the method 300 continuously. In that case the trajectory can be constructed through which the surveying head has travelled. This is in one example used for post-surveying a drilled hole.

In one example the method 300 comprises using a fusion filter. The fusion filter can be used in step 320 when calculating combined angular rates and accelerations. Thereby the accuracy of calculated attitude, position and/or trajectory can be improved even more.

One example of a fusion filter which can be used is a so-called Madgwick filter. This Madgwick filter uses a quaternion representation. Thereby accelerometer and magnetometer data can be used in an analytically derived and optimised gradient-descent algorithm. This algorithm can be used for computing the direction of the gyroscope measurement error as a quaternion derivative. Such a filter is computationally inexpensive, is effective at low sampling rates, for example 10 Hz. It can contain only one adjustable parameter k, which can be defined by observable system characteristics. In one example, the Madgwich filter is used without a magnetometer input. In one example, the adjustable parameter k, which can correspond to filter coefficients, is not updated but fixed. Such a filter is less computationally demanding than counterparts, like a Kalman-filter.

Although being described on basis of specific examples or embodiments, the present disclosure is not limited to these examples and embodiments. A person skilled in the art will with the help of the description find other ways of how to use the present disclosure within the scope of the claims. A person skilled in the art will especially be able to combine different examples or embodiments to adapt the invention to specific situations, or to find other examples of how to apply the present disclosure within the framework of the claims.

The invention claimed is:

1. A gyro-based surveying tool for surveying of holes oriented in a basically vertical direction in areas with no line-of-sight connection to the sky, the gyro-based surveying tool comprising:
   a surveying head;
   an analysing unit;
   wherein the surveying head comprises a plurality of MicroElectroMechanical-System-Inertial-Measurement-Unit (MEMS-IMU) arrangements, each of the MEMS-IMU arrangements comprising a triaxial accelerometer and a triaxial gyroscope and each of the MEMS-IMU arrangements being arranged to obtain measurement results of angular rates and accelerations of the survey head, and transmission device arranged to transmit information relating to the obtained measurement results to the analysing unit, the transmitted information relating to the measurement results comprising information relating to three degrees of acceleration and three degrees of angular rate measured by each MEMS-IMU arrangement;
   the analysing unit is arranged to receive and analyse said transmitted information relating to the measurement results from the plurality of MEMS-IMU arrangements so as to calculate a combined measurement result comprising combined angular rates and accelerations calculated based on the measured angular rates and accelerations from each MEMS-IMU arrangement out of the plurality of MEMS-IMU arrangements, the combined measurement result is calculated by averaging the accelerations and angular rates from the different MEMS-IMU arrangements;
   the surveying tool further comprises a computation device configured to calculate an attitude of said surveying head based on said combined measurement result; and
   each of said plurality of MEMS-IMU arrangements is a six-degree of freedom sensor.

2. The gyro-based surveying tool according to claim 1, further comprising means for calculating a three-dimensional position of the surveying head based on said calculated attitude and based on an along-the-hole distance of the surveying head.

3. The gyro-based surveying tool according to claim 1, the computation device is configured to determine a trajectory of said surveying head.

4. The gyro-based surveying tool according to claim 1, further comprising:
   a user unit, physically separated from the surveying head;
   a linking arrangement, being arranged to transmit information from the surveying head to the user unit.

5. The gyro-based surveying tool according to claim 1, wherein the analysing unit is arranged to calculate angular rate averaging and/or acceleration averaging of the measurements from the plurality of the MEMS-IMU arrangements and to calculate said combined measurement result based on said angular rate averaging and/or acceleration averaging.

6. The gyro-based surveying tool according to claim 1, wherein the computation device is configured to determine an along-the-hole distance of the surveying head.

7. The gyro-based surveying tool according to claim 1, wherein the plurality of said MEMS-IMU arrangements is non-north-seeking.

8. The gyro-based surveying tool according to claim 1, wherein said plurality of MEMS-IMU arrangements comprises at least three MEMS-IMU arrangements, preferably at least sixteen MEMS-IMU arrangements.

9. The gyro-based surveying tool according to claim 1, wherein the surveying head is arranged to be inserted into a hole, preferably a drilling hole or a drilled hole.

10. The gyro-based surveying tool according to claim 1, wherein the surveying head is arranged at or in a drilling arrangement, for example a bottom hole assembly.

11. The gyro-based surveying tool according to claim 1, further comprising a temperature stabilisation arrangement arranged at the plurality of MEMS-IMU arrangements and adapted to control the temperature of the plurality of MEMS-IMU arrangements.

12. The gyro-based surveying tool according to claim 1, wherein the analysing unit is arranged to calculate the combined measurement result based on a signal modelling model of the plurality of MEMS-IMU arrangements, preferably a Markov chain model, such as a first order Markov chain model.

13. A surveying method for surveying of holes oriented in a basically vertical direction in areas with no line-of-sight connection to the sky, the method comprising the steps:
   measuring angular rates and accelerations with a plurality of MEMS-IMU inside a surveying head, each of the MEMS-IMU arrangements comprising a triaxial accelerometer and a triaxial gyroscope and each of the MEMS-IMU arrangements being arranged to obtain measurement results of angular rates and accelerations of the survey head;
   transmitting said measured angular rates and accelerations from the plurality of MEMS-IMU arrangements to an analysing unit;
   calculating, by the analysing unit, combined angular rates and accelerations based on the measured angular rates and accelerations from each MEMS-IMU out of the plurality of MEMS-IMUs, wherein the combined measurement result is calculated by averaging the accelerations and angular rates from the different MEMS-IMU arrangements; and
   calculating an attitude of said surveying head based on said combined angular rates and accelerations, wherein each of the plurality of MEMS-IMUs is a six-degree of freedom sensor.

14. The surveying method according to claim 13, further comprising the step of calculating a three-dimensional position of the surveying head based on said calculated attitude and based on an along-the-hole distance of the surveying head.

15. The surveying method according to claim 14, further comprising the step of calculating a trajectory of the surveying head based on a set of several calculated three-dimensional positions of the surveying head, wherein the several calculated positions are calculated for different moments of time.

16. The surveying method according to claim 14, wherein the step of calculating a three-dimensional position of said surveying head comprises basing the calculation on a set of several combined angular rates and accelerations, wherein the several combined angular rates and accelerations are calculated for different moments of time.

17. The surveying method according to claim 14, further comprising modelling the signal of the plurality of the IMU, preferably based on a Markov chain model, preferably on a first order Markov chain model, and to base said calculation of a combined angular rate and acceleration also on said signal model.

18. The surveying method according to claim 13, further comprising controlling the temperature of said plurality of IMU.

19. The surveying method according to claim 13, said method being used for the surveying of a bore hole.

20. The surveying method according to claim 13, the method further comprising damping the vibration of the plurality of IMU.

21. A computer program stored in a non-transitory memory for surveying, where said computer program comprises program code for causing execution of the method according to claim 13.

22. A computer program product, comprising a program code stored on a non-transitory computer readable medium for executing the method according to claim 13.

* * * * *